(12) United States Patent
Abe et al.

(10) Patent No.: US 8,083,856 B2
(45) Date of Patent: Dec. 27, 2011

(54) ULTRASONIC CLEANING APPARATUS AND ULTRASONIC CLEANING METHOD

(75) Inventors: Tatsuo Abe, Nishishirakawa (JP); Hitoshi Kabasawa, Nishishirakawa (JP); Izumi Arai, Takasaki (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/864,255

(22) PCT Filed: Jan. 23, 2009

(86) PCT No.: PCT/JP2009/000248
§ 371 (c)(1),
(2), (4) Date: Jul. 23, 2010

(87) PCT Pub. No.: WO2009/107319
PCT Pub. Date: Sep. 3, 2009

(65) Prior Publication Data
US 2010/0294305 A1 Nov. 25, 2010

(30) Foreign Application Priority Data
Feb. 28, 2008 (JP) .................................. 2008-047686

(51) Int. Cl.
*B08B 3/12* (2006.01)
(52) U.S. Cl. ............................... 134/1; 15/94
(58) Field of Classification Search .................. None
See application file for complete search history.

(56) References Cited

U.S. PATENT DOCUMENTS

| 2002/0002767 A1 | 1/2002 | Yanagita et al. |
| 2002/0013065 A1 | 1/2002 | Yanagita et al. |
| 2007/0014915 A1 | 1/2007 | Nishiura et al. |

FOREIGN PATENT DOCUMENTS

| JP | A-09-260334 | 10/1997 |
| JP | A-10-229066 | 8/1998 |
| JP | A-2001-013677 | 1/2001 |
| JP | A-2002-059095 | 2/2002 |
| JP | A-2007-005472 | 1/2007 |

OTHER PUBLICATIONS

International Search Report issued in Application No. PCT/JP2009/000248; Dated Mar. 3, 2009 (With Translation).

*Primary Examiner* — Michael Kornakov
*Assistant Examiner* — Eric Golightly
(74) *Attorney, Agent, or Firm* — Oliff & Berridge, PLC

(57) ABSTRACT

An ultrasonic cleaning apparatus having at least a cleaning tank; an ultrasonic wave transmitting tank; a vibrating plate placed at a bottom portion of the ultrasonic wave transmitting tank, the vibrating plate superposing the ultrasonic waves on the transmitting water with a transducer; and a holding jig for holding the object to be cleaned in the cleaning tank, the apparatus in which the object to be cleaned is ultrasonically cleaned by immersing the object to be cleaned held with the holding jig in the cleaning liquid accommodated in the cleaning tank, putting the cleaning tank into the transmitting water accommodated in the ultrasonic wave transmitting tank, and transmitting the ultrasonic waves superposed with the vibrating plate to the cleaning tank through the transmitting water, the apparatus comprising a transmitting tank oscillating mechanism for oscillating the ultrasonic wave transmitting tank in a horizontal plane.

6 Claims, 5 Drawing Sheets

(A)

LPD=301    LPD=286    LPD=281

(B)

LPD=196    LPD=171    LPD=154

(C)

LPD=2994    LPD=2749    LPD=1545

ULTRASONIC CLEANING APPARATUS AND ULTRASONIC CLEANING METHOD

TECHNICAL FIELD

The present invention relates to an ultrasonic cleaning apparatus and an ultrasonic cleaning method in which an object to be cleaned, such as a semiconductor wafer and other semiconductor parts, is cleaned by immersing the object in chemical solution and further irradiating the object with ultrasonic waves.

BACKGROUND ART

Conventionally, an engineering part, a semiconductor part and the like are generally cleaned with an ultrasonic cleaning apparatus.

FIG. 3 shows a schematic view of an example of a conventionally general ultrasonic cleaning apparatus.

As shown in FIG. 3, the conventionally general ultrasonic cleaning apparatus 101 is provided with a cleaning tank 102 that accommodates cleaning liquid 107 for cleaning an object to be cleaned 104, an ultrasonic wave transmitting tank 103 that accommodates transmitting water 108 for transmitting ultrasonic waves to the cleaning tank 102, a vibrating plate 105 which is placed at an outer wall surface of the ultrasonic wave transmitting tank 103 and superposes the ultrasonic waves on the transmitting water 108 with an ultrasonic wave transducer 109, for example, composed of a ceramic piezoelectric device, and the like. The object to be cleaned 104 is held in the cleaning tank 102 with a holding jig 106 and the like, and immersed in the cleaning liquid accommodated in the cleaning tank 102. The cleaning tank 102 is put into the transmitting water 108 accommodated in the ultrasonic wave transmitting tank.

The ultrasonic waves superposed with the vibrating plate 105 are transmitted to the cleaning tank 102 through the transmitting water 108 so that a standing wave bounded by a surface of the cleaning liquid 107, walls of the cleaning tank and the like is formed. In this case, the cleaning liquid that is into contact with the antinode of the standing wave greatly vibrates, and the object to be cleaned 104 is cleaned by sound pressure due to the vibration.

However, since waveform of the standing wave in the cleaning liquid 107 is determined by a shape of the cleaning tank 102, a placement position and frequency of the ultrasonic wave transducer 109, and a type, temperature, a depth and the like of the cleaning liquid 107, a position of the antinode and node of the standing wave does not change provided that these conditions are constant. Therefore, since the cleaning liquid 107 hardly vibrates at the position of the node of the standing wave, a portion of the object to be cleaned 104 located at the position of the node of the standing wave cannot be sufficiently cleaned. Thus, there is a problem that the whole of the object to be cleaned cannot be cleaned uniformly, unevenness of cleaning consequently occurs and the like.

In view of the problem as described above, there is disclosed an ultrasonic cleaning apparatus that can efficiently clean by oscillating a cassette accommodating a semiconductor part in two-dimensional manner (See Japanese Patent Laid-open (Kokai) No. H9-260334).

There is also disclosed a substrate cleaning apparatus that can sufficiently remove contaminated materials over the whole surface of a substrate by arranging a plurality of the substrates, which are the object to be cleaned, and a plurality of rod members provided with the ultrasonic wave transducer at an end portion of its one side in such a manner that each main surface of the substrates and the rod members are arranged oppositely in parallel to one another, and by cleaning the substrates ultrasonically while the substrates and the rod members are relatively moved parallel (See Japanese Patent Laid-open (Kokai) No. 2002-59095).

In recent years, the ultrasonic wave of a high frequency of 1 MHz is used in the ultrasonic cleaning of the object to be cleaned such as a semiconductor part, for example, for reasons of removing particles of a wafer effectively and improving particle quality. However, the higher the frequency of the used ultrasonic wave becomes, the stronger the directivity of the ultrasonic wave becomes, and thereby affecting the foregoing problem of the unevenness of cleaning greatly.

In view of the problems, as the disclosed substrate cleaning apparatus does, the cleaning is performed while varying the position where the object to be cleaned comes into contact with the node of the standing wave by oscillating the holding jig holding the object to be cleaned or by providing a plurality of the cleaning tanks, and varying the position of the holding jig in one of the cleaning tanks or changing the cleaning tank in which the holding jig is arranged during the cleaning. However, even though the cleaning is performed by the method as described above, there are still problems that a suppression effect on the unevenness of cleaning and a removal effect on the particles of the object to be cleaned are insufficient, and apparatus cost increases in the case of providing a plurality of the cleaning tanks.

DISCLOSURE OF INVENTION

In view of the above-explained problems, it is an object of the present invention to provide an ultrasonic cleaning apparatus and an ultrasonic cleaning method that can suppress the unevenness of cleaning of the object to be cleaned due to the strong directivity, which causes the problem in cleaning by using the ultrasonic wave of a high frequency, can reduce the apparatus cost by reducing the number of the cleaning tanks, and can effectively remove the particles.

To achieve this object, the present invention provides an ultrasonic cleaning apparatus having at least a cleaning tank for accommodating cleaning liquid in which an object to be cleaned is immersed and cleaned; an ultrasonic wave transmitting tank for accommodating transmitting water through which ultrasonic waves are transmitted to the cleaning tank; a vibrating plate placed at a bottom portion of the ultrasonic wave transmitting tank, the vibrating plate superposing the ultrasonic waves on the transmitting water with a transducer; and a holding jig for holding the object to be cleaned in the cleaning tank, the apparatus in which the object to be cleaned is ultrasonically cleaned by immersing the object to be cleaned held with the holding jig in the cleaning liquid accommodated in the cleaning tank, putting the cleaning tank into the transmitting water accommodated in the ultrasonic wave transmitting tank, and transmitting the ultrasonic waves superposed with the vibrating plate to the cleaning tank through the transmitting water, the apparatus comprising a transmitting tank oscillating mechanism for oscillating the ultrasonic wave transmitting tank in a horizontal plane.

In this manner, the ultrasonic cleaning apparatus according to the present invention comprises the transmitting tank oscillating mechanism for oscillating the ultrasonic wave transmitting tank in a horizontal plane, and thus the ultrasonic waves transmitted to the object to be cleaned are made uniform by oscillating the ultrasonic wave transmitting tank in a horizontal plane. The apparatus can thereby suppress the unevenness of cleaning of the object to be cleaned, and can effectively remove the particles. In addition, the object to be cleaned can be uniformly cleaned by using one cleaning tank, and the apparatus cost can be consequently reduced. The apparatus further has an advantage that there is no risk of contaminating the cleaning liquid in the cleaning tank upon the oscillation of the ultrasonic wave transmitting tank.

In this case, the apparatus preferably comprises a holding jig oscillating mechanism for oscillating the holding jig in a horizontal plane.

In this manner, when the apparatus comprises the holding jig oscillating mechanism for oscillating the holding jig in a horizontal plane, the apparatus can more effectively suppress the unevenness of cleaning of the object to be cleaned and can more effectively remove the particles by oscillating also the holding jig in a horizontal plane.

In this case, the ultrasonic wave transmitting tank and the holding jig can be oscillated in the direction of a right angle to one another in a horizontal plane.

In this manner, when the ultrasonic wave transmitting tank and the holding jig are oscillated in the direction of a right angle to one another in a horizontal plane, the apparatus can more effectively suppress the unevenness of cleaning of the object to be cleaned and can more effectively remove the particles.

Furthermore, the present invention provides an ultrasonic cleaning method comprising the steps of: accommodating cleaning liquid in a cleaning tank, the cleaning liquid in which an object to be cleaned is immersed and cleaned; accommodating transmitting water in an ultrasonic wave transmitting tank, the transmitting water through which ultrasonic waves are transmitted to the cleaning tank; placing a vibrating plate at a bottom portion of the ultrasonic wave transmitting tank, the vibrating plate superposing the ultrasonic waves on the transmitting water with a transducer; holding the object to be cleaned with a holding jig and immersing the object to be cleaned in the cleaning liquid accommodated in the cleaning tank; putting the cleaning tank into the transmitting water accommodated in the ultrasonic wave transmitting tank; cleaning the object to be cleaned ultrasonically by transmitting the ultrasonic waves superposed with the vibrating plate to the cleaning tank through the transmitting water; wherein the object to be cleaned is ultrasonically cleaned while oscillating the ultrasonic wave transmitting tank in a horizontal plane.

In this manner, in the case that the object to be cleaned is ultrasonically cleaned while oscillating the ultrasonic wave transmitting tank in a horizontal plane, the ultrasonic waves transmitted to the object to be cleaned are made uniform, thereby the unevenness of cleaning of the object to be cleaned can be suppressed, and the particles can be effectively removed. In addition, the object to be cleaned can be uniformly cleaned by using one cleaning tank, and the apparatus cost can be consequently reduced. The method further has an advantage that there is no risk of contaminating the cleaning liquid in the cleaning tank upon the oscillation of the ultrasonic wave transmitting tank.

In this case, the holding jig is preferably oscillated in a horizontal plane.

In this manner, when the holding jig is oscillated in a horizontal plane, the unevenness of cleaning of the object to be cleaned can be more effectively suppressed and the particles can be more effectively removed.

In this case, the ultrasonic wave transmitting tank and the holding jig can be oscillated in the direction of a right angle to one another in a horizontal plane.

In this manner, when the ultrasonic wave transmitting tank and the holding jig are oscillated in the direction of a right angle to one another in a horizontal plane, the unevenness of cleaning of the object to be cleaned can be more effectively suppressed and the particles can be more effectively removed.

In the ultrasonic cleaning apparatus according to the present invention, since the object to be cleaned is ultrasonically cleaned while oscillating the ultrasonic wave transmitting tank in a horizontal plane, the ultrasonic waves transmitted to the object to be cleaned are made uniform, thereby the unevenness of cleaning of the object to be cleaned can be suppressed, and the particles can be effectively removed. In addition, the object to be cleaned can be ultrasonically cleaned uniformly by using one cleaning tank, and thereby the apparatus cost can be reduced.

BEST MODE FOR CARRYING OUT THE INVENTION

Hereinafter, an embodiment according to the present invention will be explained, but the present invention is not restricted thereto.

In recent years, cleaning by using ultrasonic wave of a high frequency of 1 MHz is utilized in the ultrasonic cleaning of the object to be cleaned such as a semiconductor part. However, the higher the frequency of the used ultrasonic wave becomes, the stronger the directivity of the ultrasonic wave becomes, thereby the unevenness of cleaning occurs due to influence of, e.g. the position of the ultrasonic wave transducer and the holding jig that holds the object to be cleaned in the cleaning tank, and the particle quality of the object to be cleaned is affected.

In view of the problems as described above, in a conventional ultrasonic cleaning apparatus, the cleaning is performed by the method of oscillating the holding jig holding the object to be cleaned or by the method of providing a plurality of the cleaning tanks, and of varying the position of the holding jig in one of the cleaning tanks or of changing the cleaning tank in which the holding jig is arranged during the cleaning. However, there are still problems that the suppression effect on the unevenness of cleaning and the removal effect on the particles of the object to be cleaned are insufficient, and the apparatus cost increases in the case of providing a plurality of the cleaning tanks. In addition, in the case of oscillating the holding jig only, the unevenness of cleaning is improved to a certain degree, whereas there newly arises a risk of contaminating the cleaning liquid itself and also a risk of spilling the cleaning liquid from the cleaning tank by ruffling the cleaning liquid.

In view of this, the present inventor repeatedly keenly conducted studies to solve the problems as described above. As a result, the inventor conceived that, in the ultrasonic cleaning by using the ultrasonic wave of a high frequency, the ultrasonic waves transmitted to the whole of the object to be cleaned are made uniform by oscillating the ultrasonic wave transmitting tank, which is provided with the vibrating plate, in a horizontal plane, thereby the unevenness of cleaning of the object to be cleaned can be suppressed, and the effect to remove the particles can be enhanced, without providing a plurality of the cleaning tanks. In this way, the object to be cleaned can be uniformly cleaned by using one cleaning tank, and it is not necessary to worry the contamination and vibration of the cleaning liquid. In this case, the present inventor conceived that, with regard to the unevenness of cleaning, more uniform cleaning effect can be obtained by oscillating also the holding jig simultaneously and oscillating them in the direction of a right angle to one another in a horizontal plane. The present inventor also investigated the best mode for carrying out these, and thereby bringing the present invention to completion.

Figure 1A:
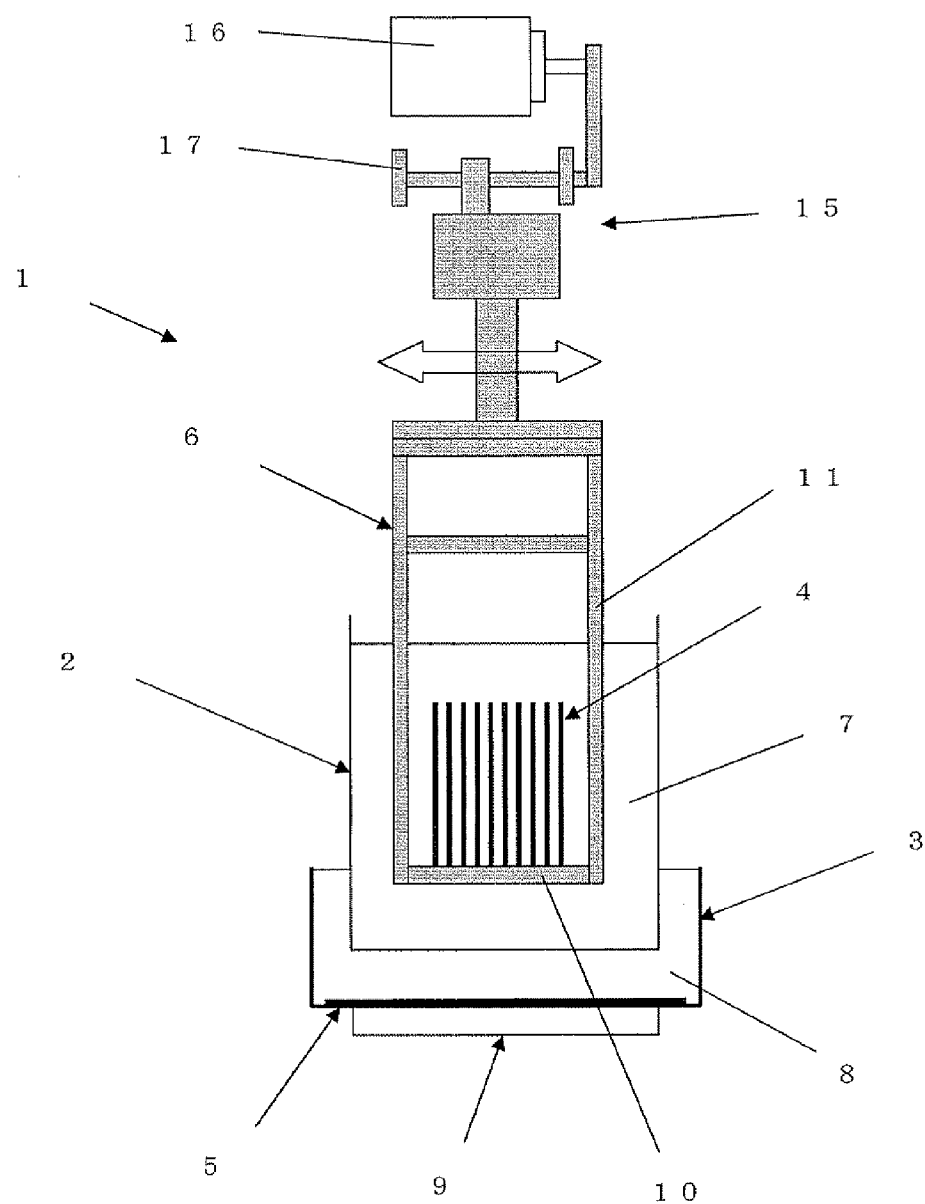
FIG. 1A is a schematic front view showing an example of the ultrasonic cleaning apparatus according to the present invention.
Figure 1B:
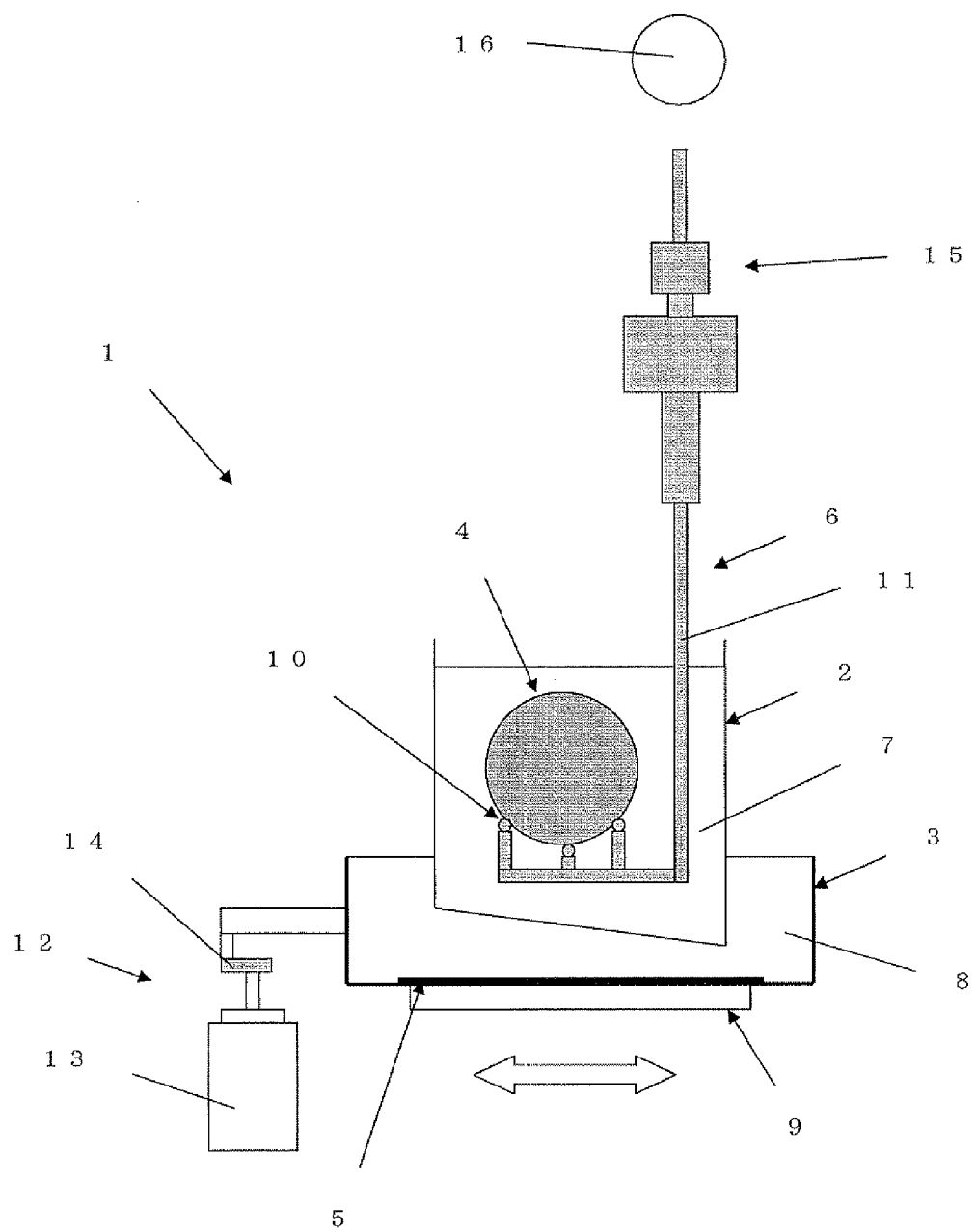
FIG. 1B is a schematic side view showing an example of the ultrasonic cleaning apparatus according to the present invention.

FIG. 1A is a schematic front view showing an example of the ultrasonic cleaning apparatus according to the present invention, and FIG. 1B is its schematic side view.

As shown in FIG. 1A and FIG. 1B, the ultrasonic cleaning apparatus 1 according to the present invention is provided with the cleaning tank 2 that accommodates the cleaning liquid 7 for immersing and cleaning the object to be cleaned 4 such as a semiconductor wafer and the like, the ultrasonic wave transmitting tank 3 that accommodates the transmitting water 8 for transmitting the ultrasonic waves to the cleaning tank 2, the vibrating plate 5 that is placed at the bottom portion of the ultrasonic wave transmitting tank 3 and superposes the ultrasonic waves on the transmitting water 8 with the transducer 9, and the holding jig 6 that holds the object to be cleaned 4 in the cleaning tank 2.

The cleaning tank 2 accommodates the cleaning liquid 7. Here, as the cleaning liquid 7, chemical solution such as SC-1 (mixed solution of ammonia water, hydrogen peroxide water and pure water) and the like can be used, or pure water can be also used. The temperature of the cleaning liquid 7 can be, for example, 5 to 90° C. The cleaning liquid 7 is supplied from a cleaning liquid inlet (not shown), which is provided in the cleaning tank 2, and discharged from a cleaning liquid outlet (not shown), which is provided in the cleaning tank 2.

As shown in FIG. 1A and FIG. 1B, in the ultrasonic cleaning apparatus 1 according to the present invention the transducer 9 and the vibrating plate 5 are placed at the bottom portion of the ultrasonic wave transmitting tank 3. The vibrating plate 5 can superpose ultrasonic waves vibration generated by the transducer 9 on the transmitting water 8.

Here, the natural frequency of the transducer 9 can be, for example, 750 KHz to 1.5 MHz. These conditions may be determined according to a cleaning purpose, and is not restricted in particular. Utilizing the ultrasonic wave of a high frequency of approximately 1 MHz enables the removal effect on the particles to be enhanced.

Moreover, as shown in FIG. 1B, a bottom surface of the cleaning tank 2 may be of a diagonal shape.

As described above, the ultrasonic wave transmitting tank 3 accommodates the transmitting water 8 for transmitting the ultrasonic waves to the cleaning tank 2. The cleaning tank 2 is put into the transmitting water 8 accommodated in the ultrasonic wave transmitting tank 3.

Such a feature that the ultrasonic wave transmitting tank 3 is arranged outside the cleaning tank 2, and the transmitting water 8 is supplied between the cleaning tank 2 and the ultrasonic wave transmitting tank 3 is useful for the contamination of the cleaning liquid, a temperature resistance problem of the ultrasonic wave transducer when the cleaning liquid temperature increases and the like, which occur in an ultrasonic cleaning apparatus having such a feature that the ultrasonic wave transducer is directly arranged at the cleaning tank.

Here, a shape of the holding jig 6 is not restricted in particular. For example, as shown in FIG. 1A and FIG. 1B, the holding jig can be composed of a holding member 10, which holds the object to be cleaned 4 from below, and a rod member 11, which is connected with the holding member 10 and extends upward. In addition, a plurality of the objects to be cleaned are placed and held on the holding member 10 of the holding jig 6.

The ultrasonic waves superposed with the vibrating plate 5 are transmitted to the cleaning tank 2 through the transmitting water 8, the standing wave bounded by the cleaning liquid surface, walls of the cleaning tank 2 and the like is formed, and the cleaning liquid that is into contact with the antinode of the standing wave greatly vibrates. The object to be cleaned 4 is cleaned by sound pressure due to this vibration.

The ultrasonic cleaning apparatus according to the present invention is provided with the transmitting tank oscillating mechanism 12 for oscillating the ultrasonic wave transmitting tank 3 in a horizontal plane.

As shown in FIG. 1B, the transmitting tank oscillating mechanism 12 has a driving motor 13 and an eccentric cam 14, and can oscillate the ultrasonic wave transmitting tank 3 in a horizontal plane by transmitting driving force from the driving motor 13 to the eccentric cam 14.

The ultrasonic cleaning apparatus according to the present invention relatively changes the position of the ultrasonic wave transducer 9 and the vibrating plate 5 against the object to be cleaned 4 by oscillating the ultrasonic wave transmitting tank 3 in a horizontal plane with the transmitting tank oscillating mechanism 12 as described above, thereby can make the ultrasonic waves transmitted to the surface of the object to be cleaned 4 uniform, can suppress the unevenness of cleaning of the object to be cleaned 4, and can effectively remove the particles. In addition, since the ultrasonic waves transmitted to the object to be cleaned 4 become uniform, it is not necessary that a plurality of the cleaning tanks are provided and the object to be cleaned 4 held with the holding jig 6 is rearranged into another cleaning tank during cleaning. The cleaning tank can number one, and the apparatus cost can be consequently reduced. In addition, a space for oscillating the holding jig in the cleaning tank is not required.

Here, the ultrasonic wave transmitting tank 3 can be oscillated in any directions in a horizontal plane, for example, can be repeatedly moved from side to side, or rotationally moved.

In this case, the apparatus preferably comprises the holding jig oscillating mechanism 15 for oscillating the holding jig 6 in a horizontal plane as shown in FIG. 1A.

The holding jig oscillating mechanism 15 has a driving motor 16 and a ball screw 17, and can oscillate the holding jig 6 in a horizontal plane by transmitting driving force from the driving motor 16 to the ball screw 17.

As described above, when the apparatus comprises the holding jig oscillating mechanism 15 for oscillating the holding jig 6 in a horizontal plane, the apparatus can more effectively suppress the unevenness of cleaning of the object to be cleaned 4 and can more effectively remove the particles by oscillating also the holding jig 6 in a horizontal plane.

Here, the holding jig 6 can be oscillated in any directions in a horizontal plane, for example, can be repeatedly moved from side to side, or rotationally moved. In order to prevent the cleaning liquid 7 from being ruffled, the holding jig 6 is preferably oscillated in the direction of a right angle to the direction of facing FIG. 1A, in a horizontal plane, that is, in the direction of a surface of the object to be cleaned 4. In this way, there is also an advantage that the cleaning liquid 7 is brought into contact with the surface of the object to be cleaned 4 more uniformly.

Figure 2:
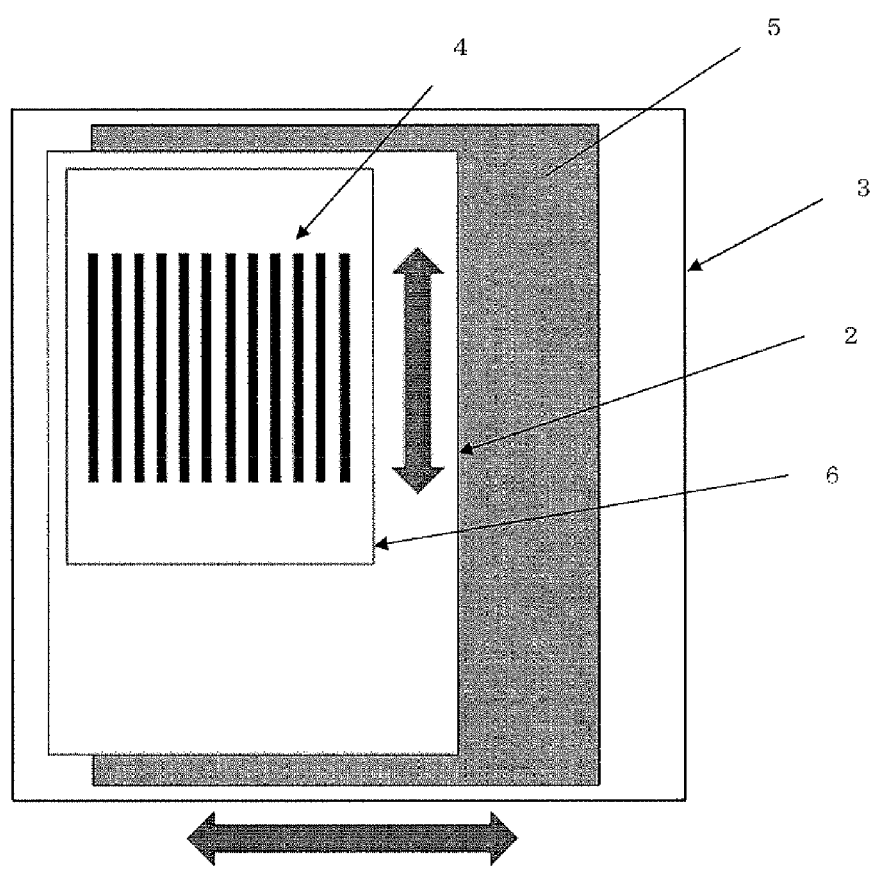
FIG. 2 is a schematic top view showing conditions where the ultrasonic wave transmitting tank and the holding jig are oscillated in the direction of a right angle to one another in a horizontal plane, in the ultrasonic cleaning apparatus according to the present invention.

In this case, as shown in FIG. 2, the ultrasonic wave transmitting tank 3 and the holding jig 6 can be oscillated in the direction of a right angle to one another in a horizontal plane.

As described above, when the ultrasonic wave transmitting tank 3 and the holding jig 6 are oscillated in the direction of a right angle to one another in a horizontal plane, the apparatus can more effectively suppress the unevenness of cleaning of the object to be cleaned 4 and can more effectively remove the particles.

Here, a distance of the oscillation of the ultrasonic wave transmitting tank 3 and the holding jig 6 is not restricted in particular. For example, a distance of the oscillation of the ultrasonic wave transmitting tank 3 can be ½ length of the vibrating plate 5 in the direction of the oscillation. Similarly, a distance of the oscillation of the holding jig 6 can be ½ length of the vibrating plate in the direction of the oscillation of the holding jig. In this way, the ultrasonic waves transmitted to the surface of the object to be cleaned can be more effectively made uniform, and the unevenness of cleaning of the object to be cleaned can be more suppressed.

Next, the ultrasonic cleaning method according to the present invention will be explained.

In the ultrasonic cleaning method according to the present invention, with the ultrasonic cleaning apparatus 1 as shown in FIG. 1A and FIG. 1B, the cleaning liquid 7 for immersing and cleaning the object to be cleaned 4 is accommodated in the cleaning tank 2. Here, as the cleaning liquid 7, chemical solution such as SC-1 and the like can be used, or pure water can be also used. The temperature of the cleaning liquid 7 can be, for example, 5 to 90° C. These conditions may be selected according to a cleaning purpose. Then, the transmitting water 8 for transmitting ultrasonic waves to the cleaning tank 2 is accommodated in the ultrasonic wave transmitting tank 3, and the cleaning tank 2 is put into the transmitting water 8 accommodated in the ultrasonic wave transmitting tank 3. The object to be cleaned 4 is held with the holding jig 6 and immersed in the cleaning liquid 7 accommodated in the cleaning tank 2.

As shown in FIG. 1A and FIG. 1B, in the ultrasonic cleaning apparatus 1 according to the present invention, the transducer 9 and the vibrating plate 5 are placed at the bottom portion of the ultrasonic wave transmitting tank 3. The vibrating plate 5 can superpose ultrasonic waves vibration generated by the transducer 9 on the transmitting water 8. The ultrasonic waves superposed with the vibrating plate 5 are transmitted to the cleaning tank 2 thorough the transmitting water 8.

Here, the natural frequency of the transducer 9 can be, for example, 750 KHz to 1.5 MHz. These conditions is not restricted in particular. Utilizing the ultrasonic wave of a high frequency of approximately 1 MHz enables the removal effect on the particles to be enhanced.

In the ultrasonic cleaning method according to the present invention, the object to be cleaned 4 is ultrasonically cleaned while oscillating the ultrasonic wave transmitting tank 3 in a horizontal plane.

As described above, in the case that the object to be cleaned 4 is ultrasonically cleaned while oscillating the ultrasonic wave transmitting tank 3 in a horizontal plane, the ultrasonic waves transmitted to the object to be cleaned 4 are made uniform, thereby the unevenness of cleaning of the object to be cleaned 4 can be suppressed, and the particles can be effectively removed. In addition, since the ultrasonic waves transmitted to the object to be cleaned 4 become uniform, it is not necessary that a plurality of the cleaning tanks are provided and the object to be cleaned 4 held with the holding jig 6 is rearranged into another cleaning tank during cleaning. The cleaning tank can number one, and the apparatus cost can be consequently reduced.

Here, the ultrasonic wave transmitting tank 3 can be oscillated in any directions in a horizontal plane, for example, can be repeatedly moved from side to side, or rotationally moved.

In this case, the holding jig 6 is also preferably oscillated in a horizontal plane to suppress the unevenness of cleaning.

As described above, when the holding jig 6 is also oscillated in a horizontal plane, the unevenness of cleaning of the object to be cleaned 4 can be more effectively suppressed and the particles can be more effectively removed.

Here, the holding jig 6 can be oscillated in any directions in a horizontal plane, for example, can be repeatedly moved from side to side, or rotationally moved. In order to prevent the cleaning liquid 7 from being ruffled, the holding jig 6 is preferably oscillated in the direction of a right angle to the direction of facing FIG. 1A, in a horizontal plane, that is, in the direction of a surface of the object to be cleaned 4. In this way, there is also an advantage that the cleaning liquid 7 is brought into contact with the surface of the object to be cleaned 4 more uniformly.

In this case, as shown in FIG. 2, the ultrasonic wave transmitting tank 3 and the holding jig 6 can be oscillated in the direction of a right angle to one another in a horizontal plane.

As described above, when the ultrasonic wave transmitting tank 3 and the holding jig 6 are oscillated in the direction of a right angle to one another in a horizontal plane, the unevenness of cleaning of the object to be cleaned 4 can be more effectively suppressed and the particles can be more effectively removed.

Here, a distance of the oscillation of the ultrasonic wave transmitting tank 3 and the holding jig 6 is not restricted in particular. For example, a distance of the oscillation of the ultrasonic wave transmitting tank 3 can be ½ length of the vibrating plate in the direction of the oscillation. Similarly, a distance of the oscillation of the holding jig 6 can be ½ length of the vibrating plate in the direction of the oscillation of the holding jig. In this way, the ultrasonic waves transmitted to the surface of the object to be cleaned can be more effectively made uniform, and the unevenness of cleaning of the object to be cleaned can be more suppressed.

As explained above, in the ultrasonic cleaning apparatus according to the present invention, since the object to be cleaned is ultrasonically cleaned while oscillating the ultrasonic wave transmitting tank in a horizontal plane, the unevenness of cleaning of the object to be cleaned can be suppressed, and the particles can be effectively removed. In addition, the object to be cleaned can be ultrasonically cleaned uniformly by using one cleaning tank and thereby the apparatus cost can be reduced. Furthermore, there is an advantage that the ultrasonic wave transmitting tank can be oscillated without contaminating and ruffling the cleaning liquid in the cleaning tank.

Hereinafter, the present invention will be explained in more detail based on Example and Comparative Example, but the present invention is not restricted thereto.

Example 1

With the ultrasonic cleaning apparatus according to the present invention as shown in FIG. 1A and FIG. 1B, three silicon wafers having a diameter of 300 mm, which were subjected to mirror polishing, were ultrasonically cleaned for 10 minutes while oscillating the ultrasonic wave transmitting tank. After the cleaning, the particles of the wafers were measured with a wafer surface inspection apparatus. As the cleaning liquid, the mixed solution of ammonia water, hydrogen peroxide water and pure water (SC-1) was used, and its mixture ratio was 1:1:10. The temperature of the cleaning liquid was 50° C. and the frequency of the ultrasonic wave was 1 MHz.

Figure 4:
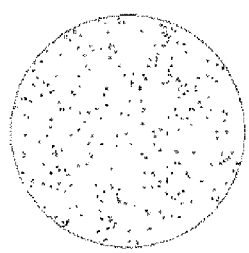
FIG. 4 are views showing conditions of particles on a surface of the wafers after cleaning in Examples and Comparative Example, in which (A) shows the wafer surface in Example 1, (B) shows the wafer surface in Example 2, and (C) shows the wafer surface in Comparative Example.
Figure 4:
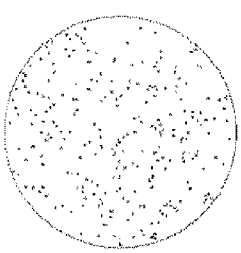
Figure 4:
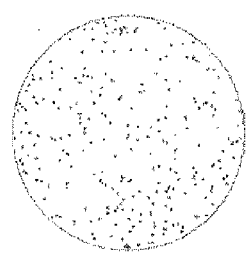
Figure 4:
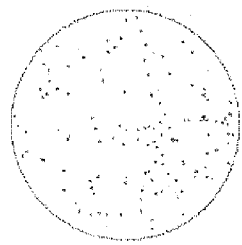
Figure 4:
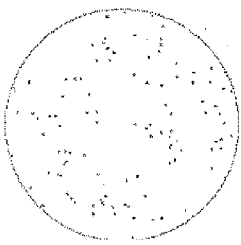
Figure 4:
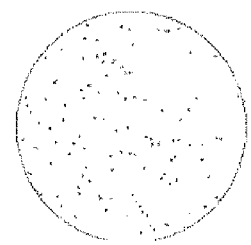
Figure 4:
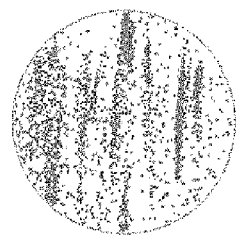
Figure 4:
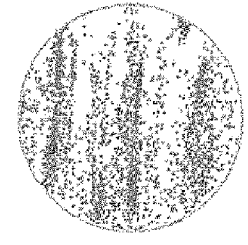
Figure 4:
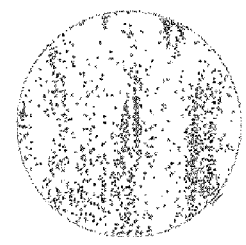

As a result, the number of the particles was 301 in wafer 1, 286 in wafer 2, and 281 in wafer 3. FIG. 4(A) shows conditions of the particles on the surface of the wafers after the cleaning.

Accordingly, it was able to confirm that, in comparison with Comparative Example described below, the removal effect on the particles was improved and the unevenness of cleaning of the wafers was suppressed.

Example 2

The wafers were ultrasonically cleaned while the holding jig was simultaneously oscillated as shown in FIG. 2 in addition to the same conditions as Example 1, and the particles were measured by the same way as Example 1.

As a result, the number of the particles was 196 in wafer 1, 171 in wafer 2, and 154 in wafer 3. FIG. 4(B) shows conditions of the particles on the surface of the wafers after the cleaning.

Accordingly, it was able to confirm that, in comparison with Comparative Example described below, the removal effect on the particles was improved and the unevenness of cleaning of the wafers was more suppressed.

Comparative Example

Figure 3:
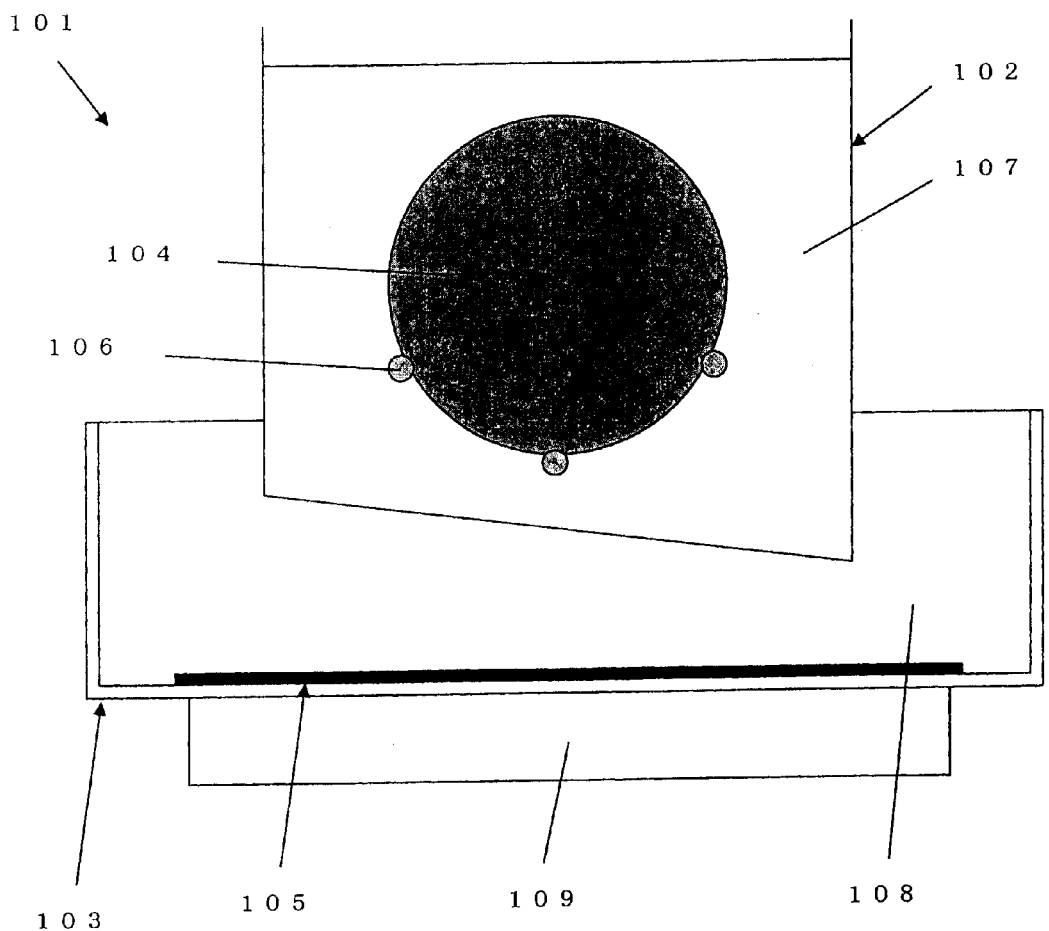
FIG. 3 is a schematic view showing an example of a conventional ultrasonic cleaning apparatus.

With the conventional ultrasonic cleaning apparatus as shown in FIG. 3, the wafers were ultrasonically cleaned in the same conditions as Example 1 except of cleaning without the oscillation of the ultrasonic wave transmitting tank and the holding jig, and the particles were measured.

As a result, the number of the particles was 2994 in wafer 1, 2749 in wafer 2, and 1545 in wafer 3. FIG. 4(C) shows conditions of the particles on the surface of the wafers after the cleaning.

As shown in FIG. 4(C), there resulted in leaving the particles, which were regarded as being based on a polishing agent, without removing.

Table 1 shows the combined results of Examples and Comparative Example.

|  | WAFER 1 | WAFER 2 | WAFER 3 |
|---|---|---|---|
| COMPARATIVE EXAMPLE | 2994 | 2749 | 1545 |
| EXAMPLE 1 | 301 | 286 | 281 |
| EXAMPLE 2 | 196 | 171 | 154 |

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. An ultrasonic cleaning apparatus having at least
   a cleaning tank for accommodating cleaning liquid in which an object to be cleaned is immersed and cleaned;
   an ultrasonic wave transmitting tank for accommodating transmitting water through which ultrasonic waves are transmitted to the cleaning tank;
   a vibrating plate placed at a bottom portion of the ultrasonic wave transmitting tank, the vibrating plate superposing the ultrasonic waves on the transmitting water with a transducer; and
   a holding jig for holding the object to be cleaned in the cleaning tank,
   the apparatus in which the object to be cleaned is ultrasonically cleaned by immersing the object to be cleaned held with the holding jig in the cleaning liquid accommodated in the cleaning tank, putting the cleaning tank into the transmitting water accommodated in the ultrasonic wave transmitting tank, and transmitting the ultrasonic waves superposed with the vibrating plate to the cleaning tank through the transmitting water,
   the apparatus comprising a transmitting tank oscillating mechanism for oscillating the ultrasonic wave transmitting tank in a horizontal plane.

2. The ultrasonic cleaning apparatus according to claim 1, further comprising a holding jig oscillating mechanism for oscillating the holding jig in a horizontal plane.

3. The ultrasonic cleaning apparatus according to claim 2, wherein the ultrasonic wave transmitting tank and the holding jig are oscillated in the direction of a right angle to one another in a horizontal plane.

4. An ultrasonic cleaning method comprising the steps of:
   accommodating cleaning liquid in a cleaning tank, the cleaning liquid in which an object to be cleaned is immersed and cleaned;
   accommodating transmitting water in an ultrasonic wave transmitting tank, the transmitting water through which ultrasonic waves are transmitted to the cleaning tank;
   placing a vibrating plate at a bottom portion of the ultrasonic wave transmitting tank, the vibrating plate superposing the ultrasonic waves on the transmitting water with a transducer;
   holding the object to be cleaned with a holding jig and immersing the object to be cleaned in the cleaning liquid accommodated in the cleaning tank;
   putting the cleaning tank into the transmitting water accommodated in the ultrasonic wave transmitting tank;
   cleaning the object to be cleaned ultrasonically by transmitting the ultrasonic waves superposed with the vibrating plate to the cleaning tank through the transmitting water; wherein
   the object to be cleaned with a transmitting tank oscillating mechanism is ultrasonically cleaned while oscillating the ultrasonic wave transmitting tank in a horizontal plane.

5. The ultrasonic cleaning method according to claim 4, wherein the holding jig is oscillated in a horizontal plane.

6. The ultrasonic cleaning method according to claim 5, wherein the ultrasonic wave transmitting tank and the holding jig are oscillated in the direction of a right angle to one another in a horizontal plane.

* * * * *